United States Patent
Lowery

(10) Patent No.: US 7,968,902 B2
(45) Date of Patent: Jun. 28, 2011

(54) LIGHT EMITTING DEVICES WITH CONSTANT FORWARD VOLTAGE

(75) Inventor: Chris Lowery, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 256 days.

(21) Appl. No.: 12/060,116

(22) Filed: Mar. 31, 2008

(65) Prior Publication Data

US 2009/0242902 A1    Oct. 1, 2009

(51) Int. Cl.
*H01L 29/22* (2006.01)
(52) U.S. Cl. ............ 257/99; 257/13; 257/79; 257/94; 257/154; 257/E33.058; 257/E33.001
(58) Field of Classification Search ............ 257/13, 257/79, 94, 99, 154, E33.001, E33.058
See application file for complete search history.

(56) References Cited

U.S. PATENT DOCUMENTS

| 6,044,097 A * | 3/2000 | Kawamura et al. ........ 372/38.01 |
| 7,026,655 B2 * | 4/2006 | Go et al. ................... 257/81 |
| 7,193,250 B2 * | 3/2007 | Ohno ...................... 257/115 |
| 7,595,513 B2 * | 9/2009 | Plank et al. ............... 257/98 |
| 2003/0193095 A1 * | 10/2003 | Sasaki et al. ............. 257/784 |
| 2008/0315176 A1 * | 12/2008 | Takeuchi et al. ........... 257/13 |

* cited by examiner

*Primary Examiner* — Andy Huynh
(74) *Attorney, Agent, or Firm* — Arent Fox LLP

(57) ABSTRACT

A light emitting device and method for producing the same is disclosed. The light emitting device includes a semiconductor material, an electrode positioned on the semiconductor material, a wire bonding area, and a resistor connected between the wire bonding area and the electrode.

19 Claims, 3 Drawing Sheets

LIGHT EMITTING DEVICES WITH CONSTANT FORWARD VOLTAGE

BACKGROUND

1. Field

The present disclosure relates to light emitting devices, and more particularly, to light emitting devices with constant forward voltage.

2. Background

Light emitting diodes (LEDs) are attractive candidates for replacing conventional light sources, such as incandescent lamps and fluorescent light sources. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Furthermore, LEDs require lower voltages than fluorescent lamps, and therefore, are better suited for applications in which the light source must be powered from a low-voltage source, such as a battery or an internal computer DC power source.

Unfortunately, LEDs produce light in a relatively narrow spectrum band. To replace conventional lighting sources, LEDs that generate light that appears to be "white" to the human observer are required. A light source that appears to be white and that has a conversion efficiency comparable to that of fluorescent light sources can be constructed from a blue LED that is covered with a layer of phosphor that converts a portion of the blue light to yellow light. These LEDs will be referred to as "white LEDs".

White LEDs are based on wide band gap semiconductors, such as InGaN (indium gallium nitride) and the like. These semiconductors emit light when electrically biased by a voltage $(V_f)$ in the forward direction of the p-n junction. To achieve the brightness that is required for many applications, these semiconductors are generally driven at the maximum rated current, and therefore, are designed with the lowest possible forward voltage $V_f$ to minimize power consumption. This poses several challenges to one skilled in the art when multiple LEDs with different forward voltages $V_f$ are required to be connected together in parallel. If one LED has a significantly lower resistance in such an arrangement, it will draw more current until it gets so hot that its internal resistance rises to match that of the other LEDs. This heating leads to many undesirable effects, such as color shift, different light output and other electrical and thermal non-uniformities. To avoid these problems, LEDs have to be paired with resistors so that each LED/resistor pair in the parallel arrangement has a constant ohmic value. Another approach is to carefully select or "bin" the LEDs for similar values of $V_f$.

Recent advances in LED technology have resulted in a new generation of the LEDs that provide significantly more light. As a result, skilled artisans may be ready to trade some of the light output for a constant forward voltage $V_f$, thus eliminating the need for a series current limiting resistor or binning.

SUMMARY

In one aspect of the disclosure, a light emitting device includes a semiconductor material, an electrode positioned on the semiconductor material, a wire bonding area, and a resistor connected between the wire bonding area and the electrode.

In another aspect of the disclosure, a light emitting device includes a semiconductor material, an electrode positioned on the semiconductor material, a wire bonding area, and means for providing a resistance between the wire bonding area and the electrode.

In a further aspect of the disclosure, an apparatus includes a plurality of light emitting devices connected in parallel, each of the light emitting devices includes a semiconductor material, an electrode positioned on the semiconductor material, a wire bonding area, and a resistor connected between the wire bonding area and the electrode, wherein each of the light emitting devices comprises a forward voltage within a predetermined tolerance.

In yet a further aspect of the disclosure, a method of producing a light emitting device includes forming an electrode on a semiconductor material, and forming a resistance between the electrode and a wire bonding area to set a forward voltage for the light emitting device within a predetermined tolerance.

It is understood that other aspects of the present invention will become readily apparent to those skilled in the art from the following detailed description, wherein it is shown and described only examples of various aspects of the invention by way of illustration. As will be realized, the invention includes other and different aspects and its several details are capable of modification in various other respects, all without departing from the spirit and scope of the present invention. Accordingly, the drawings and detailed description that follow are to be regarded as illustrative in nature and not as restrictive.

BRIEF DESCRIPTION OF THE DRAWINGS

Various aspects of the present invention are illustrated by way of example, and not by way of limitation, in the accompanying drawings, wherein.

DETAILED DESCRIPTION

The detailed description set forth below in connection with the appended drawings is intended as a description of various aspects of the present invention and is not intended to represent all ways in which the present invention may be practiced. The detailed description may include specific details for the purpose of providing a thorough understanding of the present invention, however, it will be apparent to those skilled in the art that the present invention may be practiced without these specific details. In some instances, well-known structures and components are summarily described and/or shown in block diagram form in order to avoid obscuring the concepts of the present invention.

A LED is a semiconductor material impregnated, or doped, with impurities. Depending on the kind of impurity, a doped region of the semiconductor can have predominantly electrons or holes, and is referred to as n-type or p-type semiconductor regions, respectively. In LED applications, the semiconductor includes an n-type semiconductor region and a p-type semiconductor. The difference in the doping on each side of the p-n junction causes diffusion current between the two types of material, which results in the build up of a reverse electric field at equilibrium. The reverse electric field appears in some region about the p-n junction. This region is often referred to as the active region. When a forward voltage $V_f$, sufficient to overcome the reverse electric field, is applied across the p-n junction, electrons and holes are forced into the active region and recombine. When an electron recombines with a hole, it falls to a lower energy level and release energy in the form of light.

In the following detailed description, various aspects of LEDs will be described in the context of a LED having a lateral structure. However, as those skilled in the art will readily appreciate, the various aspects presented throughout this disclosure are likewise applicable to other LED structures, including by way of example, LEDs with vertical structures, flip-chip structures, and the like. Accordingly, any reference to a lateral structure LED is intended only to illustrate various aspects, with the understanding that such aspects have a wide range of applications.

Figure 1:
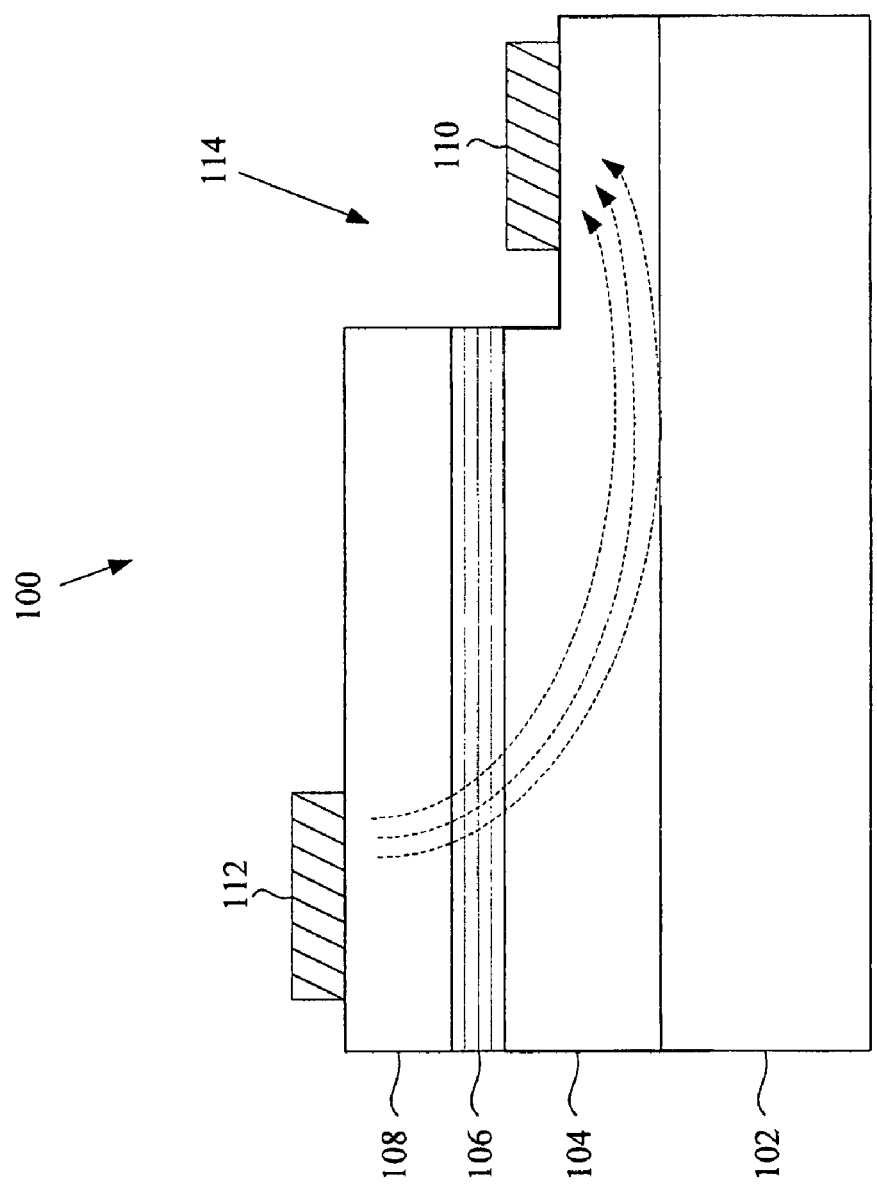
FIG. 1 is a cross-section view illustrating an example of a LED having a lateral structure.

FIG. 1 is a cross-section view illustrating an example of a LED having a lateral structure. In this example, the LED 100 has a heterostructure formed on a substrate 102 by metal-organic phase epitaxy, or by some other means. The heterostructure includes an n-type semiconductor layer 104 and a p-type semiconductor layer 108 that sandwiches an active region 106 (i.e., a light producing region). As shown in FIG. 1, the n-type semiconductor layer 104 is formed between the substrate 102 and the p-type semiconductor layer 108, however, the layered heterostructure may be reversed. That is, the p-type semiconductor layer 108 may be formed between the substrate 102 and the n-type semiconductor layer 104. As those skilled in the art will readily appreciate, the various concepts described throughout this disclosure may be extended to any suitable heterostructure.

As shown in FIG. 1, regions on the surface of the n-type and p-type semiconductor layers 104, 108, are metallized to form electrodes 110, 112, respectively. The electrodes 110, 112 provide a means to provide electrical power to the LED 100. The p-type semiconductor layer 108 is exposed at the top surface, and therefore, may be readily formed thereon. However, the n-type semiconductor layer 104 is buried beneath the p-type semiconductor layer 108 and the active region 106. Accordingly, to form the n-type electrode 110, a cutout area 114 is formed by removing a portion of the p-type semiconductor layer 108 by means well known in the art to expose the n-type semiconductor layer 104 therebeneath. After the portion of the p-type semiconductor layer 108 is removed, the n-type electrode 110 may be formed.

When a forward voltage $V_f$ is applied across the electrodes 110, 112, electrons and holes from the n-type and p-type semiconductor layers 104, 108, respectively, are forced into the active region 106 and recombine, thereby releasing energy in the form of light. A forward voltage "$V_f$" means a voltage sufficient to overcome the reverse electric field in the active region 106 when the p-type electrode 112 is connected to the positive terminal of a voltage source (not shown) and the n-type electrode 110 is connected to the negative terminal of the voltage source. The arrows inside the LED 100 show the current flowing between the electrodes in the lateral direction.

Figure 2:
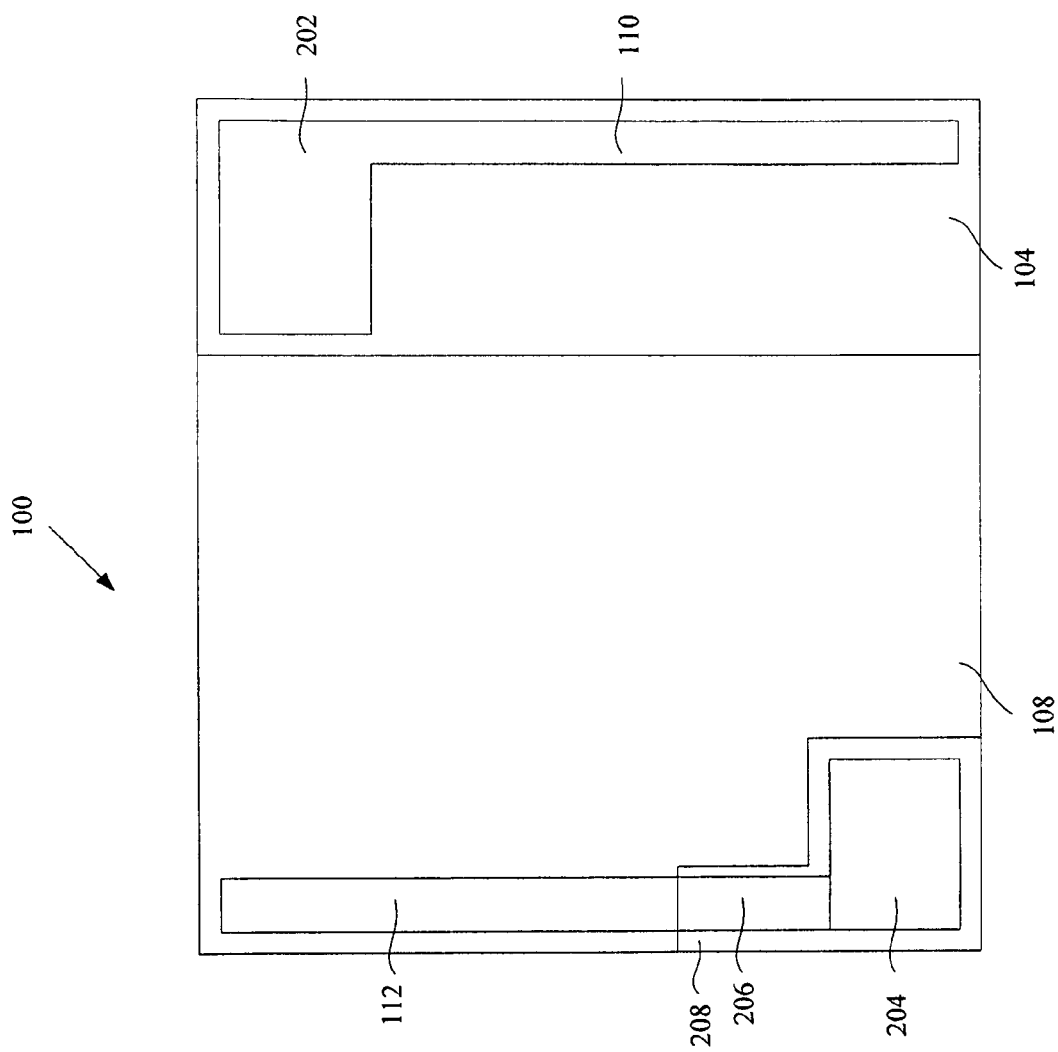
FIG. 2 is a top view illustrating an example of a LED having a lateral structure.

FIG. 2 is a top view illustrating an example of a LED having a lateral structure. In this example, the n-type and p-type electrodes 110, 112, respectively, have an elongated structure. The n-type electrode 110 is connected to a wire bonding area 202, which together are formed on the n-type semiconductor layer 104, where the portion of the p-layer semiconductor layer 108 has been removed (i.e., the cutout area 114 shown in FIG. 1). The p-type electrode 112 is connected to a wire bonding area 204 through a resistor 206, which together are formed on the p-type semiconductor layer 108. A dielectric 208 is formed beneath the wire bonding area 204 and the resistor 206 to insulate it from the p-type semiconductor layer 108.

The strength of the reverse electric field that exists across the active region depends in large part on the concentration of impurities in the semiconductor material. As a result, the reverse electric field may very from LED to LED. The variance in electric field strength may exist even among LEDs manufactured from the same wafer. In a manner to be described in greater detail later, the resistor 206 connected between the wire bonding area 204 and the p-type electrode 112 may be used to maintain a fairly constant forward voltage $V_f$ for LEDs manufactured from the same or multiple wafers. Alternatively, or in addition to, a resistor (not shown) may be used to connect the n-type electrode 110 to its wire bonding area 202. The resistor 206 may be adjusted during test to achieve a forward voltage $V_f$ within a predetermined tolerance. The resistor 206 may be adjusted by laser trimming or by some other suitable process.

Each wire bonding area 202, 204 is sufficiently large to receive a wire. The wire extending from each wire bonding area 202, 204 is connected to one of the two leads extending from the LED-package (not shown). An LED-package generally includes one or more LEDs mounted to a metallic clad printed circuit board and encased by a half-spherical dome. The wire bonding area 202 for the n-type electrode 110 may be formed directly on the n-type semiconductor layer 104 as shown in FIG. 2, or alternatively, a dielectric layer (not shown) may be formed beneath the wire bonding area 202, or any portion thereof. The dielectric layer tends to increase the reflectivity of the wire bonding area 202, thereby reducing undesirable absorption of light that might otherwise occur.

Figure 3:
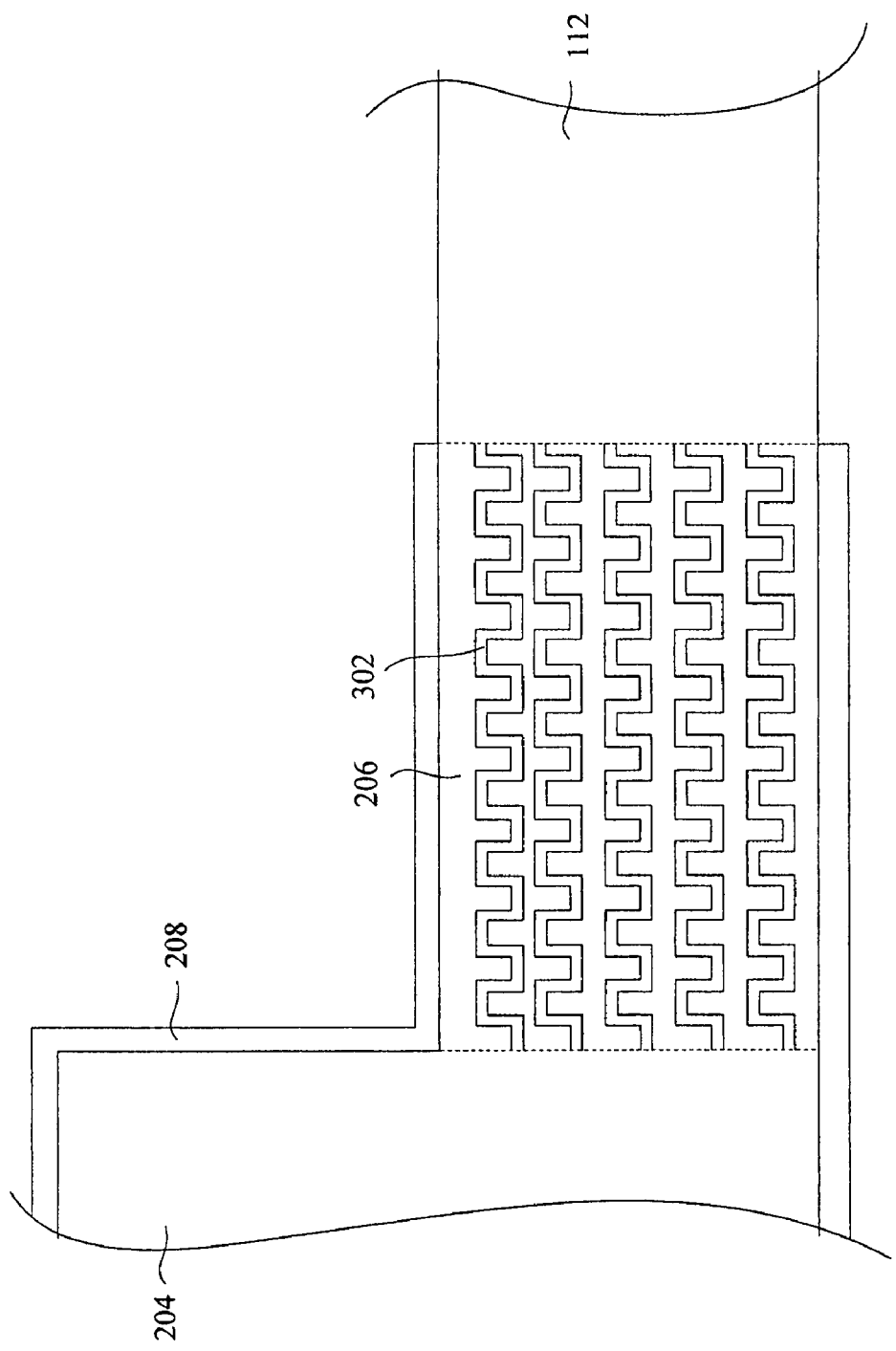
FIG. 3 is a top view illustrating an example of a resistor formed on a heterostructure for a LED.

FIG. 3 is a top view illustrating an example of a resistor formed on a heterostructure of a LED. The resistor 206 is constructed with multiple electrical conductors 302 connected in parallel. The conductors 302 may be formed on the dielectric 208 through a metallic deposition process or by some other means. Laser trimming may be used to alter the attributes of one or more conductors 302, a process which is a well known in the art. In this manner, the resistance value of the resistor 206 may be increased by trimming and/or removing one or more conductors 302 until the resistance necessary to achieve the desired forward voltage $V_f$ is achieved.

The resistance value of each conductor 302 is based on its geometric dimensions (i.e., cross-sectional area and length). Consequently, the range of resistance values that can be achieved by laser trimming, or the like, for any given resistor 206 depends on the conductor pattern. A conductor with a meandering pattern, as shown in FIG. 3, by way of example, has a higher resistance value than a conductor that extends straight across the resistor 206 because it has a longer length (assuming equal cross-sectional areas). Thus, the conductor pattern for any particular implementation may vary depending on the design parameters for a specific application.

The range of resistance values that can be achieved by laser trimming, or the like, may also be set by controlling the cross-sectional areas of the conductors 302. In many applications, the conductors 302 will be substantially planar, are therefore, the cross-sectional area may not provide the same flexibility as the conductor pattern to vary the range of resistance values that can be achieved.

Laser trimming may be used to in a variety of ways to adjust the resistance value of the resistor 206. By way of example, laser trimming may be used to create a lateral cut in one or more conductors 302 and/or reduce the cross-sectional area of the same. In both cases, the current flow path is narrowed, which increases the resistance value of the conductor 302 and resistor 206. Alternatively, in addition to, laser trimming may be used to remove or burn away one or more conductors 302.

An automated trimming process may be used wherein the forward voltage $V_f$ for the LED is measured continuously and compared to a nominal value within a predetermined tolerance. The laser stops automatically when the measured forward voltage $V_f$ reaches the nominal value.

LEDs with a forward voltage $V_f$ within a predetermined tolerance may be used in numerous applications. By way of example, these LEDs may be well suited for liquid crystal display (LCD) backlighting applications, where strings of four or more LEDs are connected in parallel. Other applications may include, but are not limited to, automobile interior lighting, light bulbs, lanterns, streetlights, flashlights, or any other application where multiple LEDs are used parallel.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting device, comprising:
    a semiconductor material comprising an active region, the active region comprising a resistance;
    an electrode positioned on the semiconductor material and electrically coupled to the active region resistance;
    a wire bonding area coupled to the electrode; and
    an adjustable resistor connected in series with the active region resistance between the wire bonding area and the electrode,
    wherein the adjustable resistor and the resistance of the semiconductor active region form a predetermined resistance ohmic value for the light emitting device.

2. The light emitting device of claim 1 wherein a value of resistance of the adjustable resistor is capable of adjustment by laser trimming.

3. The light emitting device of claim 1 wherein the resistor comprises one or more conductors connected in parallel.

4. The light emitting device of claim 3 wherein each of the one or more conductors are substantially planar.

5. The light emitting device of claim 3 wherein each of the one or more conductors comprises a meandering pattern between the wire bonding area and the electrode.

6. The light emitting device of claim 3 wherein the adjustable resistor comprises an area where one or more additional conductors have been removed.

7. The light emitting device of claim 3 wherein at least one of the one or more conductors have been altered.

8. The light emitting device of claim 3 further comprising a material to insulate the wire bonding area and the one or more conductors from the semiconductor material.

9. The light emitting device of claim 3 wherein each of the one or more conductors comprises at least one material selected from the group consisting of nickel and chromium.

10. A light emitting device, comprising:
    a semiconductor material comprising an active region, the active region comprising a resistance;
    an electrode positioned on the semiconductor material and electrically coupled to the active region resistance;
    a wire bonding area coupled to the electrode; and
    means for providing a resistor in series with the resistance between the wire bonding area and the electrode, wherein the resistor and the resistance of the semiconductor active region form a predetermined ohmic value for the light emitting device.

11. The light emitting device of claim 10 wherein the means for providing a resistor between the wire bonding area and the electrode comprises an adjustable resistor.

12. The light emitting device of claim 11 wherein the adjustable resistor is capable of adjustment by laser trimming.

13. The light emitting device of claim 10 wherein the means for providing a resistor between the wire bonding area and the electrode comprises one or more conductors connected in parallel.

14. The light emitting device of claim 13 wherein each of the one or more conductors is substantially planar.

15. The light emitting device of claim 13 wherein each of the one or more conductors comprises a meandering pattern between the wire bonding area and the electrode.

16. The light emitting device of claim 13 wherein the means for providing a resistor between the wire bonding area and the electrode comprises an area where one or more additional conductors have been removed.

17. The light emitting device of claim 13 wherein at least one of the one or more conductors have been altered.

18. The light emitting device of claim 13 further comprising means for insulating the wire bonding area and the one or more conductors from the semiconductor material.

19. An apparatus, comprising:
    a plurality of light emitting devices connected in parallel, each of the light emitting devices comprising,
    a semiconductor material comprising a resistance,
    an electrode positioned on the semiconductor material and electrically coupled to the resistance;
    a wire bonding area coupled to the electrode; and
    an adjustable resistor connected in series with the resistance between the wire bonding area and the electrode, wherein the adjustable resistor and the resistance of the semiconductor material form a predetermined ohmic value for the light emitting device; and
    wherein each of the light emitting devices comprises a forward voltage within a predetermined tolerance.

* * * * *